US00RE41538E

(19) United States
(12) Reissued Patent
Cunningham

(10) Patent Number: US RE41,538 E
(45) Date of Reissued Patent: Aug. 17, 2010

(54) METHOD FOR MAKING INTEGRATED CIRCUIT INCLUDING INTERCONNECTS WITH ENHANCED ELECTROMIGRATION RESISTANCE USING DOPED SEED LAYER AND INTEGRATED CIRCUITS PRODUCED THEREBY

(76) Inventor: James A. Cunningham, 19771 Junipero Way, Saratoga, CA (US) 95070

(21) Appl. No.: 11/113,454

(22) Filed: Apr. 22, 2005

Related U.S. Patent Documents

Reissue of:
(64) Patent No.: 6,551,872
Issued: Apr. 22, 2003
Appl. No.: 09/642,140
Filed: Aug. 18, 2000

U.S. Applications:

(63) Continuation of application No. 09/619,587, filed on Jul. 19, 2000.
(60) Provisional application No. 60/150,156, filed on Aug. 20, 1999, and provisional application No. 60/145,036, filed on Jul. 22, 1999.

(51) Int. Cl.
*H01L 21/8238* (2006.01)
*H01L 23/48* (2006.01)

(52) U.S. Cl. ..... 438/225; 438/618; 438/637; 438/638; 438/663; 438/677; 438/678; 438/687; 438/622; 438/675; 257/750; 257/751; 257/752; 257/758; 257/762; 257/765; 257/E21.175; 257/E21.467; 257/E21.469; 257/E21.585

(58) Field of Classification Search ..... 438/225, 438/675, 677, 687, 660, 678, 663, 638, 637, 438/618, 622; 257/751, 752, 758, 765, 750, 257/762, E21.175, E21.467, E21.469, E21.576, 257/E21.585
See application file for complete search history.

(56) References Cited

U.S. PATENT DOCUMENTS 4,233,067 A 11/1980 Sawada
4,592,891 A 6/1986 Nishikawa et al.
4,732,731 A 3/1988 Asai et al.

(Continued)

FOREIGN PATENT DOCUMENTS

| | | |
|---|---|---|
| JP | 60110868 | 6/1985 |
| JP | 62127438 | 6/1987 |
| JP | 62133050 | 6/1987 |
| JP | 1028337 | 1/1989 |

(Continued)

OTHER PUBLICATIONS

Filippi, et al. "The Effect of Copper Concentration on the Electromigration Lifetime of Layered Aluminum–Copper (Ti–AlCu–Ti) Metallurgy with Tungsten Diffusion Barriers", Jun. 1992, VMIC Conference, pp. 359–365.

(Continued)

*Primary Examiner*—Long K Tran

(57) ABSTRACT

A method for making an integrated circuit device includes forming at least one interconnect structure adjacent a substrate by forming at least one barrier layer, forming a doped copper seed layer on the at least one barrier layer, and forming a copper layer on the doped copper seed layer. The method may further include annealing the integrated circuit device after forming the copper layer to diffuse the dopant from the doped copper seed layer into grain boundaries of the copper layer. The doped copper seed layer may include at least one of calcium, cadmium, zinc, neodymium, tellurium, and ytterbium as a dopant to provide the enhanced electromigration resistance. Forming the copper layer may comprise plating the copper layer. In addition, forming the copper layer may comprise forming the copper layer to include at least one of calcium, cadmium, zinc, neodymium, tellurium, and ytterbium as a dopant. In some embodiments, the dopant in the seed layer may be sufficient so that no additional dopant is needed in the copper layer.

75 Claims, 4 Drawing Sheets

U.S. PATENT DOCUMENTS

| | | | | | |
|---|---|---|---|---|---|
| 4,750,029 | A | | 6/1988 | Futatsuka et al. | |
| 4,908,275 | A | | 3/1990 | Tsuji et al. | |
| 4,986,856 | A | | 1/1991 | Tanigawa et al. | |
| 5,130,274 | A | | 7/1992 | Harper et al. | |
| 5,143,867 | A | | 9/1992 | d'Heurle et al. | |
| 5,592,024 | A | | 1/1997 | Aoyama et al. | |
| 5,624,506 | A | | 4/1997 | Tsuzaki et al. | |
| 5,674,787 | A | | 10/1997 | Zhao et al. | |
| 5,694,184 | A | | 12/1997 | Yamada et al. | |
| 5,695,810 | A | * | 12/1997 | Dubin et al. | 438/643 |
| 5,719,447 | A | | 2/1998 | Gardner | |
| 5,789,320 | A | | 8/1998 | Andricacos et al. | |
| 5,830,563 | A | | 11/1998 | Shimoto et al. | |
| 6,037,257 | A | | 3/2000 | Chiang et al. | |
| 6,037,664 | A | | 3/2000 | Zhao et al. | |
| 6,060,892 | A | | 5/2000 | Yamagata | |
| 6,066,892 | A | | 5/2000 | Ding et al. | |
| 6,077,780 | A | | 6/2000 | Dubin | |
| 6,100,194 | A | | 8/2000 | Chan et al. | |
| 6,100,195 | A | | 8/2000 | Chan et al. | |
| 6,136,707 | A | | 10/2000 | Cohen | |
| 6,140,234 | A | | 10/2000 | Uzoh et al. | |
| 6,143,422 | A | | 11/2000 | Nagai et al. | |
| 6,147,402 | A | | 11/2000 | Joshi et al. | |
| 6,157,081 | A | | 12/2000 | Nariman et al. | |
| 6,174,799 | B1 | | 1/2001 | Lopatin et al. | |
| 6,180,523 | B1 | | 1/2001 | Lee et al. | |
| 6,181,012 | B1 | * | 1/2001 | Edelstein et al. | 257/762 |
| 6,197,688 | B1 | | 3/2001 | Simpson | |
| 6,214,728 | B1 | | 4/2001 | Chan et al. | |
| 6,249,055 | B1 | | 6/2001 | Dubin | |
| 6,268,291 | B1 | * | 7/2001 | Andricacos et al. | 438/694 |
| 6,303,498 | B1 | | 10/2001 | Chen et al. | |

FOREIGN PATENT DOCUMENTS

| | | |
|---|---|---|
| JP | 1056842 | 3/1989 |
| JP | 2230756 | 9/1990 |
| JP | 9157775 | 6/1997 |
| JP | 10008167 | 1/1998 |

OTHER PUBLICATIONS

Paunovic et al. "Electrochemically Deposited Diffusion Barriers"; Jul. 1994; J. Electrochem Soc., vol. 141, No. 7, pp. 1843–1850, The Electrochemical Society, Inc.

Abe et al., "Cu Damascene Interconnects with Crystallographic Texture Control and its Electromigration Performance", Jun. 1998, 36.sup.th Annual International Reliability Physics Symposium, pp. 342–347.

O'Sullivan et al. "Electrolessly Deposited Diffusion Barriers for Microelectronics"; Sep. 1998, IBM J. Res. Develop vol. 42, No. 5, pp. 607–619.

* cited by examiner

METHOD FOR MAKING INTEGRATED CIRCUIT INCLUDING INTERCONNECTS WITH ENHANCED ELECTROMIGRATION RESISTANCE USING DOPED SEED LAYER AND INTEGRATED CIRCUITS PRODUCED THEREBY

Matter enclosed in heavy brackets [ ] appears in the original patent but forms no part of this reissue specification; matter printed in italics indicates the additions made by reissue.

RELATED APPLICATIONS

This application is a based upon provisional application Ser. No. 60/150,156 filed Aug. 20, 1999, now abandoned and is a continuation-in-part application of U.S. patent application Ser. No. 09/619,587 filed on Jul. 19, 2000 which, in turn, is based upon prior filed provisional application Ser. No. 60/145,036 filed Jul. 22, 1999, the entire disclosures of all of which are incorporated herein by reference.

FIELD OF THE INVENTION

The present invention relates to the field of integrated circuits and integrated circuit manufacturing, and more particularly, to making interconnection structures with enhanced electromigration resistance, and while not significantly increasing the resistivity of the metal.

BACKGROUND OF THE INVENTION

A metal interconnect system in wide use in the later 1990's included an Al+Cu alloy interconnect line clad on each side with a barrier metal, and combined with planarized tungsten plugs for vias. A via is the structure that provides the electrical connection from one vertical level of interconnects to the next. The system saw wide acceptance in the industry, especially for high performance logic applications, such as microprocessor chips. The system was perceived as satisfactory, except that a severe degradation in electromigration resistance was noted on test patterns with multiple levels of interconnects and tungsten plug vias, versus test patterns using one interconnect level and no vias.

As much as a 100 times reduction in median-time-to-failure ($T_{50}$) values, or more, were noted. One technical paper covering this phenomenon in detail is by R. G. Filippi et al., entitled, "The Effect of Copper Concentration on the Electromigration of Layered Aluminum-Copper (Ti-AlCu-Ti) Metallurgy With Tungsten Diffusion Barriers." The paper appears in the 1992 VMIC Conference Proceedings, on page 359. The researchers showed that the copper doping is swept away from the tungsten in the direction of current flow. The aluminum, then depleted of its copper, electromigrates rapidly and voids appear at or near the W/Al interface. Increasing the concentration of copper helps to a limited extent, but degrades the resistivity. Stripes with a close by "reservoir" of copper also showed improvement, but none of these measures completely solved the problem. In general, the phenomenon may be referred to as a flux divergence at a dissimilar material interface.

A similar phenomenon has been noted in a copper system with tungsten plugs. This was reported, for example, by Kazuhide Abe, et al., and coworkers in a paper entitled, "Cu Damascene Interconnects with Crystallographic Texture Control and Its Electromigration Performance," and appears in the IEEE 1998 Reliability Physics Symposium Proceedings on page 342.

The widely-accepted dual Damascene copper systems does not use tungsten plugs between interconnect levels, but does employ a barrier metal. This barrier layer lies, in general, between the upper surface of a copper interconnect and the bottom of an overlying copper via. Thus, some flux divergence may occur at this interface at high current density. The location of the copper metal depletion depends on the direction of current flow. For example, if the current flows up into overlying metal, this is the area of voiding and damage.

SUMMARY OF INVENTION

In view of the foregoing background, it is therefore an object of the invention to provide a integrated circuit processing method which eliminates or significantly diminishes the flux divergence phenomenon such that little degradation of electromigration resistance occurs at the via structures relative to other regions in the interconnect system.

Another object of the invention is to provide a thin, hardened alloy skin on selected copper surfaces to reduce electromigration resistance and/or provide for passivation.

These and other objects, features and advantages in accordance with the present invention are provided by a method for making an integrated circuit device comprising forming at least one interconnect structure adjacent a substrate by forming at least one barrier layer, forming a doped copper seed layer on the at least one barrier layer, and forming a copper layer on the doped copper seed layer. The method may further comprise annealing the integrated circuit device after forming the copper layer to diffuse the dopant from the doped copper seed layer into grain boundaries of the copper layer. The doped copper seed layer may include at least one of calcium, cadmium, zinc, neodymium, tellurium, and ytterbium as a dopant to provide the enhanced electromigration resistance.

Forming the copper layer may comprise plating the copper layer. In addition, forming the copper layer may comprise forming the copper layer to include at least one of calcium, cadmium, zinc, neodymium, tellurium, and ytterbium as a dopant. In some embodiments, the dopant in the seed layer may be sufficient so that no additional dopant is needed in the copper layer.

The method may further comprise forming at least one dielectric layer adjacent the substrate, and forming at least one opening in the at least one dielectric layer for receiving the at least one interconnect structure therein. Forming the at least one barrier layer may include forming at least one barrier layer comprising metal. The barrier layer may comprise one of tantalum nitride and tantalum silicon nitride. Alternately, the barrier layer may include cobalt and phosphorous. The method may also include forming a displacement plated copper layer on which the at least one barrier layer is formed.

Another aspect of the invention relates to an integrated circuit device. More particularly, the device may include a substrate, at least one dielectric layer adjacent the substrate and having at least one opening therein, and at least one interconnect structure in the at least one opening. The interconnect structure may comprise at least one barrier layer adjacent the at least one opening, a doped copper seed layer on the at least one barrier layer, and a copper layer on the doped copper seed layer. The copper layer may comprise grain boundaries adjacent the doped copper seed layer containing dopant therein. These grain boundaries may be filled during an annealing step during processing. The doped copper seed layer may comprise at least one of calcium, cadmium, zinc, neodymium, tellurium, and ytterbium as a dopant. If desired, the copper layer may also comprise at least one of calcium, cadmium, zinc, neodymium, tellurium, and ytterbium as a dopant.

DETAILED DESCRIPTION OF THE PREFERRED EMBODIMENTS

Figure 1:
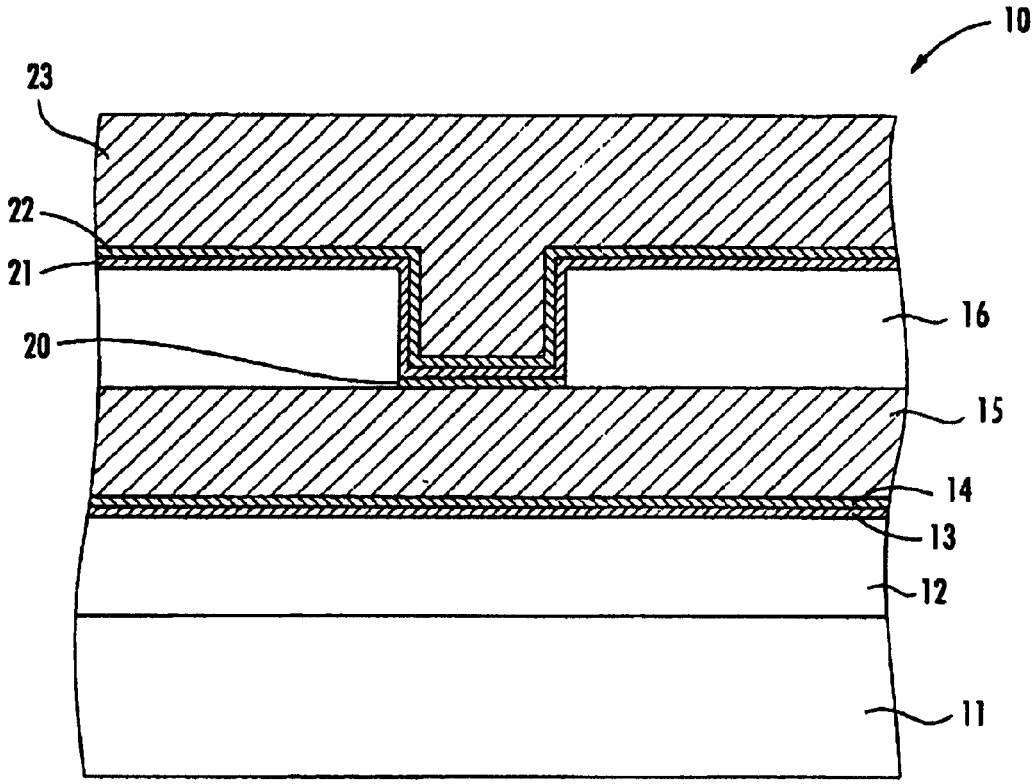
FIG. 1 is a schematic cross-sectional view of an integrated circuit device made in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used in an alternate embodiment to indicate similar elements.

Referring initially to FIGS. 1–4, the method for making an integrated circuit device 10 in accordance with the invention is first described. The device 10 includes a substrate 11 in which various doped regions (not shown) may be formed to define active devices, such as transistors, etc. as will be readily appreciated by those skilled in the art. One or more dielectric layers 12 may be formed over the substrate 11. The dielectric layer 12 may be patterned and etched and filled with metal, such as copper or an alloy thereof, to define the copper interconnect line 15. As will also be appreciated by those skilled in the art, at least one barrier metal layer 13, and a copper seed layer 14 may be formed prior to electrodeposition of the copper interconnect 15. Those of skill in the art will appreciate that various etch stop layers may also be provided, however, these layers are not shown for clarity.

Figure 2:
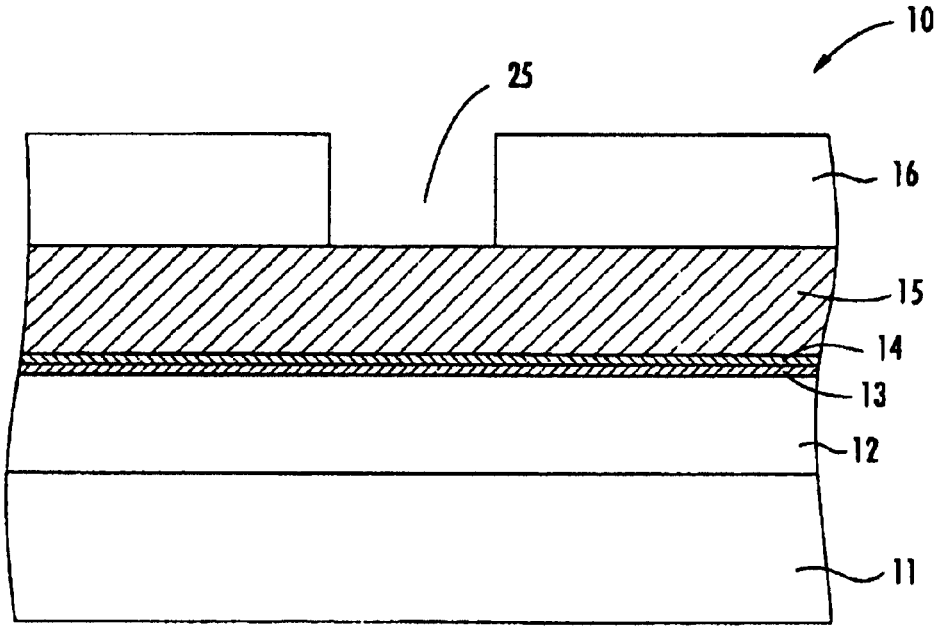
FIGS. 2 through 4 are schematic cross-sectional views of the integrated circuit device as shown in FIG. 1 during various processing steps.
Figure 3:
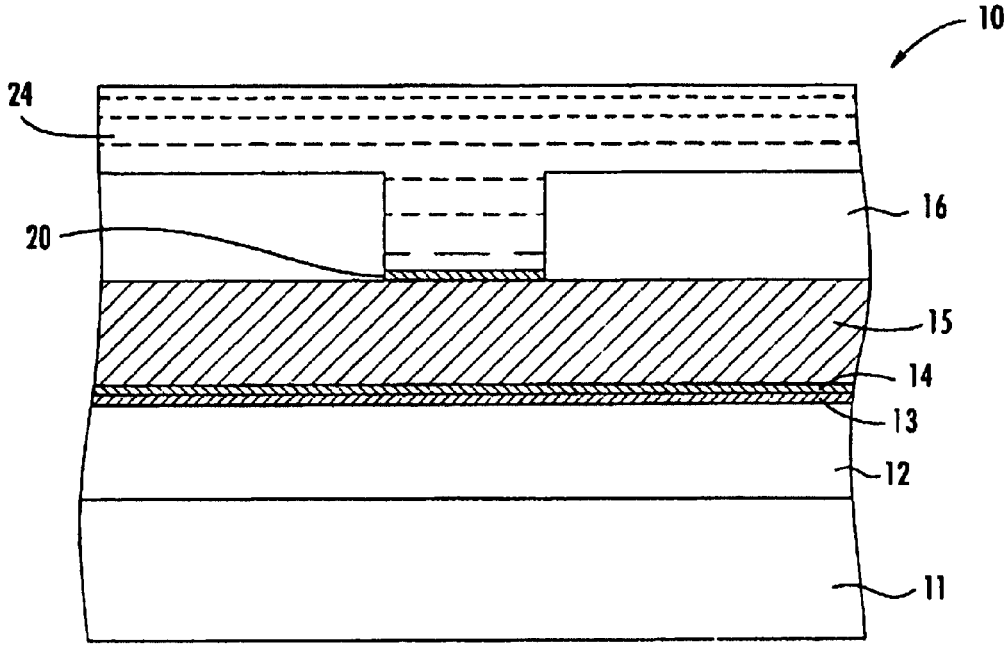

As shown in FIG. 2, an opening 25 may be formed extending through the dielectric layer 16 using conventional techniques. As shown in FIG. 3, the device 10 is subjected to a plating bath 24 including a plating metal more noble than copper. This forms a thin plating layer 20 on the exposed surface portion of the copper interconnect 15. This may be followed by an anneal which drives in the more noble metal a short distance into the copper, such that the electromigration resistance of the copper near the barrier layer 21 is greatly improved. This also passivates the exposed copper interconnect 15 improving its resistance to oxidation and staining. This process is readily implemented in a cost effective manner.

Figure 4:
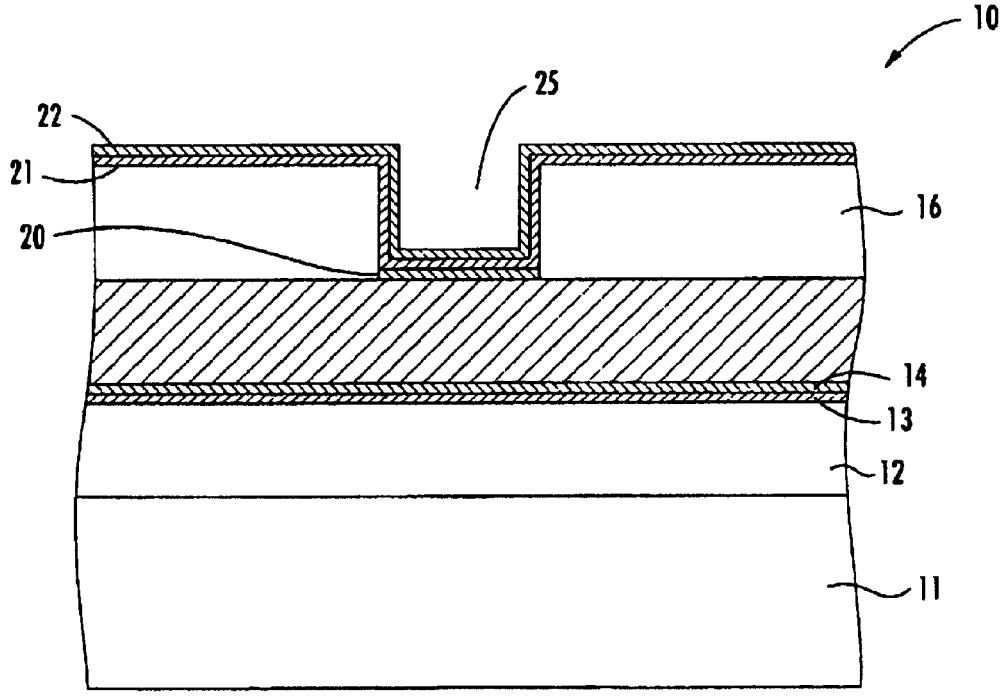

As shown in FIG. 4, a barrier layer 21 and a copper seed layer 22 may be formed to line the opening 25 as will be appreciated by those skilled in the art. The barrier layer 21 may be tantalum nitride, tantalum silicon nitride, or other similar materials as will be appreciated by those skilled in the art. The resulting opening 25 may then be filled with copper, such as using copper electroplating techniques, for example, to form the structure shown in FIG. 1.

By selection of relatively inert metals, such as Pd or Pt, the invention also tends to passivate the temporarily exposed surface of the copper until the next step in the process is underway. This reduces oxidation and staining of the copper.

Alternatively, the copper interconnect 15 may be displacement plated following its delineation by CMP as is normally used in the Damascene approach as will be appreciated by those skilled in the art. In other words, in other embodiments, the entire upper surface could be displacement plated as described herein.

Several metals have higher reduction potentials than copper, that is, are more noble than copper. Selected reduction potentials are as follows: $Ag^+ \rightarrow Ag$, 0.8 volts; $Au^+ \rightarrow Au$, 1.7 volts; $Pd^{++} \rightarrow Pd$, 0.95 volts; $Ir^{+++} \rightarrow Ir$, 1.2 volts; $Rh^{++} \rightarrow Rh$, 0.6 volts; $Hg^{++} \rightarrow Hg$, 0.8 volts; $Pt^{++} \rightarrow Pt$, 1.2 volts, Copper itself exhibits a single electrode potential of $Cu^+ \rightarrow Cu$, 0.52 volts. Any metal in a simple ion solution which has a reduction potential more positive than copper will spontaneously oxidize the copper and plate itself onto the copper as the metal. The displacement plating can be achieved using simple ion chemistries, such as sulfates or chlorides as will be appreciated by those skilled in the art. A monolayer or more will form depending on the porosity of the coating. A metal which is less noble than copper, such as cadmium, $Cd^+ \rightarrow Cd$, −0.4 volts, will not undergo the displacement reaction with copper.

After the formation of the very thin metal coating or plating layer 20, an anneal is preferably performed sometime in the wafer processing flow so that the metal is driven into the copper a few atomic layers downward. For palladium, for example, considering the bulk diffusion constant of Pd through Cu, the diffusion length $\sqrt{Dt}$ for an anneal of one hour at 450° C. is about 100 Å. Thus a zone of roughly 100 Å of Cu+Pd alloy wold be characterized by a marked increase in electromigration resistance due primarily, in this case, to a reduced rate of material transport from lattice diffusion processes.

Palladium and other metals listed above may not have ideal metallurgical characteristics which lend themselves towards the reduction of material transport rates due to high current density effects. In this case, however, the dopants would exist in high concentration. This is a factor which would tend to offset negative factors and which might contribute to their efficacy.

The deposition method described is not an electroless plating process. Thus, the coating or plating layer 20 thickness is self-limiting, and does not tend to coat the adjacent dielectric material 16. For this reason, the concentration of the metal in the aqueous plating bath 24 and the plating time are not critical as will be readily appreciated by those skilled in the art.

The rise in resistivity in the narrow zone of copper near the surface would be large with the high concentration of dopant. But, since the thickness of the effected layer is so narrow, the added via resistance would be small.

Such a treatment will tend to form a more stable transition from the barrier metal to the undoped or lightly-doped copper of the seed layer 22, reducing material transport rates during high current density periods.

In order to similarly protect the copper metal 23 on the upper side of the barrier layer 21, the seed layer 22 upon which the copper is plated may be sputter deposited with dopants. For example, the seed layer 22 cold be 300–500 Å thick, sputter deposited, and contain 0.2 to 3 at.% Cd or Zn. The copper seed layer 22 could also include at least one of calcium, neodymium, tellurium, and ytterbium.

Figure 5:
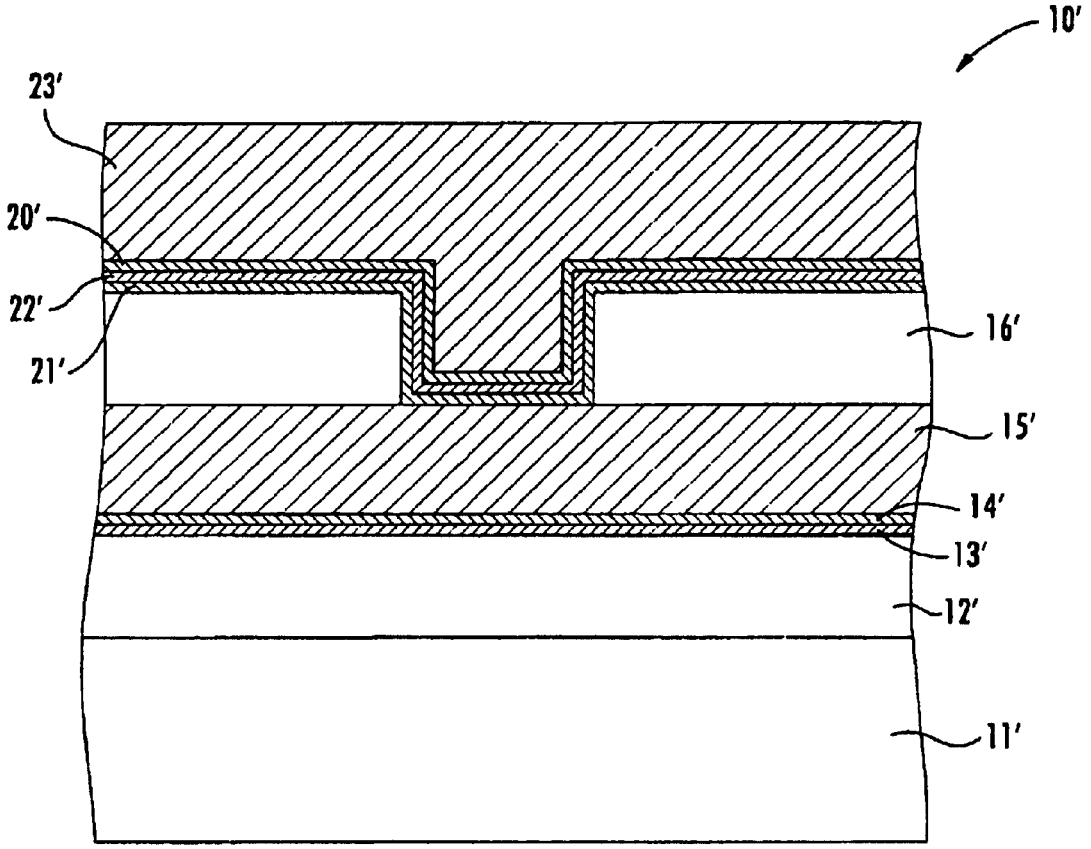
FIG. 5 is a schematic cross-sectional view of an integrated circuit device in accordance with an alternate embodiment of the invention.

Alternatively, as explained with reference to FIG. 5, the seed layer 22' could be undoped copper or one of the alloys mentioned above which is then displacement plated to form the plating layer 20' on the seed layer along the lines as described above. The main copper alloy layer 23' may then be plated on the displacement plating layer 20' as shown in the illustrated embodiment.

As scaling down into submicron dimensions continues in the semiconductor industry, the deposition of a uniform and conformal barrier metal into contact and via openings becomes increasingly difficult. This holds true for coating methods, such as sputtering and to a somewhat lesser extent for CVD methods. But plating methods, such as electroless plating, offer improved conformality. Various metal barrier films deposited by electroless methods have been studied. For example, some of these results appear in E. J. O'Sullivan et al., "Electrolessly deposited diffusion barriers for microelectronics," IBM J. Res. Dev. Vol. 42, No. 5, September 1998, p. 607; and Milan Paunovic et al., "Electrochemically Deposited Diffusion Barriers," J. Electrochem. Soc., 141, No. 7, July 1994, p. 1843. This work showed that out of several candidates, a barrier of Co+P gave the best results. Electroless "Co(P)" did not interdiffuse with copper even with extended heating at 400° C. This alloy may be plated to dielectric surfaces by activation with $PdCl_2$, as will be readily appreciated by those skilled in the art.

Figure 6:
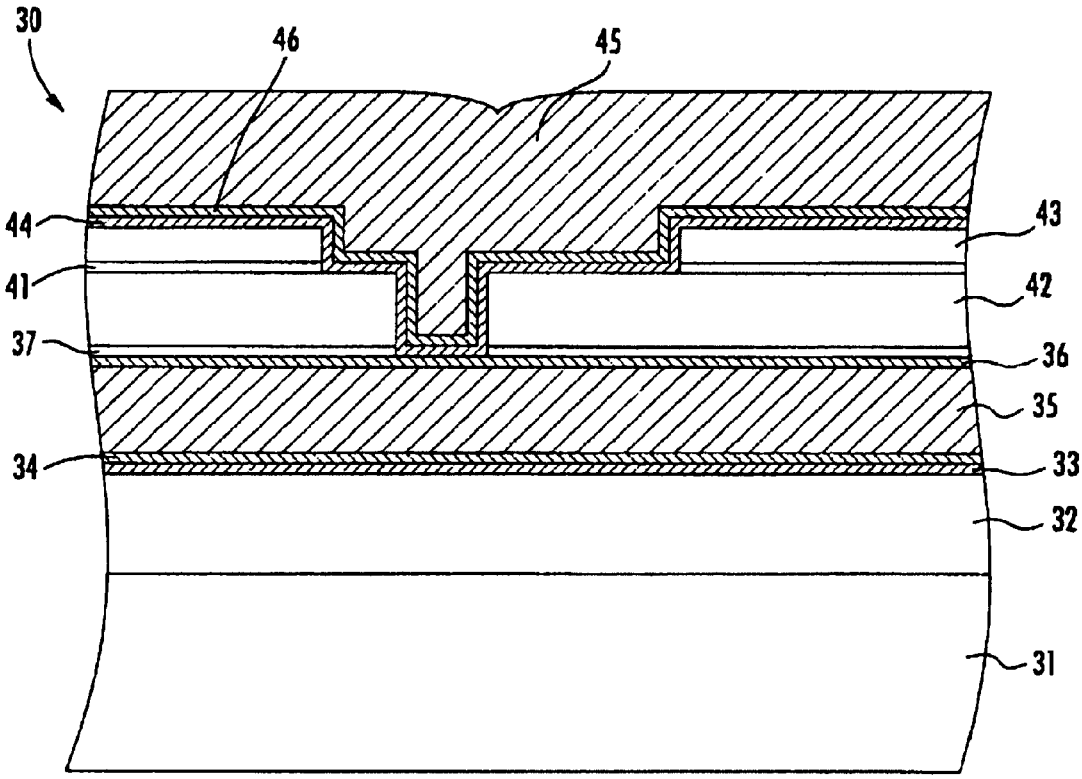
FIG. 6 is a schematic cross-sectional view of another embodiment of an integrated circuit device in accordance with the invention.

Referring now additionally to FIG. 6 it is described how such an electroless coating may be combined with displacement plating to give an improved electromigration resistant via in an integrated circuit device 30 which also enjoys a cost effective and more uniform copper barrier metal. In this embodiment, a first copper interconnect line 35 is formed on a seed layer 34, which is formed on a barrier layer 33. The barrier layer 33 is illustratively on a dielectric layer 32 adjacent the substrate 31. A platinum displacement plated layer 36 is illustratively formed on the upper surface of the underlying copper interconnect 35. This helps spread the current emerging downward from the via and also helps to reduce surface (or interface) diffusion rates for the copper interconnect.

First and second nitride layers 37 and 41 are shown adjacent the top and bottom, respectively, of a second dielectric layer 42 which act as etch stops as will be appreciated by those skilled in the art. A third dielectric layer 43 is provided on the upper etch stop layer 41 in the illustrated embodiment. A second barrier layer 44 is also provided to line or coat the opening for the second interconnect line 45 as will also be appreciated by those of skill in the art of Damascene copper technology. The upper surface portion of the copper interconnect layer 45 will be polished flush in a subsequent step as will be understood by those skilled in the art.

In accordance with another important aspect of the invention, a doped copper seed layer 46 is provided on which the copper interconnect layer 45 is formed. This doped copper seed layer may be deposited by sputtering. Alternately, an all electrochemically formed copper-based interconnect may be formed by first forming the electrolessly deposited barrier layer 44 as shown, and then electroplating the doped seed layer 46 on the activated barrier layer. The activation may be accomplished by displacement or electrolessly plating a very thin layer of a more noble metal, such as Pd, Pt, Ag or Au, for example, as discussed above.

Following the doped seed layer 46 deposition, the thick copper or copper alloy film 45 may be built up by electroplating, for example. The doped copper or copper alloy seed layer 46 may have a higher dopant concentration than the bulk interconnect layer 45 increasing the process latitude. The doped copper seed layer 46 may include a dopant comprising at least one of calcium, cadmium, zinc, neodymium, tellurium, and ytterbium. Such a system provides an electromigration resistant via in both current directions as will be appreciated by those skilled in the art. Of course, in some embodiments, the bulk copper interconnect layer 45 may also include the same or other such dopants to enhance electromigration resistance as described herein.

Other related concepts and discussions are provided in the following U.S. patent applications: Ser. No. 09/045,610, filed Mar. 20, 1998; Ser. No. 09/148,096 filed on Sep. 4, 1998; Ser. No. 09/271,179 filed on Mar. 17, 1999; Ser. No. 09/289,331 filed on Apr. 9, 1999; Ser. No. 09/619,587 filed on Jul. 19, 2000; Ser. No. 60/150,156 filed on Aug. 20, 1999; Ser. No. 60/153,400 filed on Sep. 10, 1999; and Ser. No. 60/159,068 filed on Oct. 12, 1999. The entire disclosure of each of these applications is incorporated herein by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A method for making an integrated circuit device, comprising:

forming at least one interconnect structure [adjacent a substrate by], *wherein said forming at least one interconnect structure comprises:* forming at least one barrier layer[,];

forming a doped copper seed layer on the at least one barrier layer, *wherein* the doped copper seed layer [including] *includes* a dopant comprising at least one of [calcium,] cadmium[, neodymium,] *or* tellurium[, and ytterbium,]; and forming a copper layer on the doped copper seed layer.

2. A method according to claim 1 further comprising annealing the integrated circuit device after forming the copper layer to diffuse the dopant from the doped copper seed layer into grain boundaries of the copper layer.

3. A method according to claim 1 wherein forming the copper layer comprises plating the copper layer.

4. A method according to claim 1 wherein forming the copper layer comprises forming the copper layer to include a dopant comprising at least one of calcium, cadmium, zinc, neodymium, tellurium, [and] *or* ytterbium.

5. A method according to claim 1, further comprising:

forming at least one dielectric layer adjacent [the] *a* substrate; and forming at least one opening in the at least one dielectric layer for receiving the at least one interconnect structure therein.

6. A method according to claim 1 wherein forming the at least one barrier layer comprises forming at least one barrier layer comprising metal.

7. A method according to claim 1 wherein forming the at least one barrier layer comprises forming at least one barrier layer comprising *at least* one of tantalum nitride [and] *or* tantalum silicon nitride.

8. A method according to claim 1 wherein forming the at least one barrier layer comprises forming at least one barrier layer comprising cobalt and phosphorous.

9. A method according to claim 1 further comprising forming a displacement plated copper layer on which the at least one barrier layer is formed.

10. A method for making an integrated circuit device, comprising:

forming at least one interconnect structure [adjacent a substrate by], *wherein said forming at least one interconnect structure comprises:* forming at least one metal barrier layer[,];

forming a doped copper seed layer on the at least one metal barrier layer, *wherein* the doped copper seed layer [including] *includes* a dopant comprising at least one of [calcium,] cadmium[, neodymium,] *or* tellurium[, and ytterbium,]; and forming a copper layer on the doped copper seed layer.

11. A method according to claim 10 further comprising annealing the integrated circuit device after forming the copper layer to diffuse the dopant from the doped copper seed layer into grain boundaries of the copper layer.

12. A method according to claim 10 wherein forming the copper layer comprises plating the copper layer.

13. A method according to claim 10 wherein forming the copper layer comprises forming the copper layer to include a dopant comprising at least one of calcium, cadmium, zinc, neodymium, tellurium, [and] *or* ytterbium.

14. A method according to claim 10, further comprising:

forming at least one dielectric layer adjacent [the] *a* substrate; and forming at least one opening in the at least one dielectric layer for receiving the at least one interconnect structure therein.

15. A method according to claim 10 wherein forming the at least one metal barrier layer comprises forming at least one metal barrier layer comprising *at least* one of tantalum nitride [and] *or* tantalum silicon nitride.

16. A method according to claim 10 wherein forming the at least one metal barrier layer comprises forming at least one metal barrier layer comprising cobalt and phosphorous.

17. A method according to claim 10 further comprising forming a displacement plated copper layer on which the at least one metal barrier layer is formed.

18. A method for making an integrated circuit device, comprising:

forming at least one interconnect structure [adjacent a substrate by], *wherein said forming at least one interconnect structure comprises:* forming at least one barrier layer[,];

forming a doped copper seed layer on the at least one barrier layer, *wherein* the doped copper seed layer [including] *includes* a dopant comprising at least one of calcium, cadmium, neodymium, tellurium, [and] *or* ytterbium[,];

plating a copper layer on the doped copper seed layer, *wherein the doped copper seed layer has a higher dopant concentration than the copper layer;* and annealing the integrated circuit device after forming the copper layer to diffuse the dopant from the doped copper seed layer into the copper layer.

19. A method according to claim 18, further comprising doping the copper layer with at least one of calcium, cadmium, zinc, neodymium tellurium, [and] *or* ytterbium prior to annealing.

20. A method according to claim 18, further comprising:

forming at least one dielectric layer adjacent [the] *a* substrate; and forming at least one opening in the at least one dielectric layer for receiving the at least one interconnect structure therein.

21. A method according to claim 18 wherein forming the at least one barrier layer comprises forming at least one barrier layer comprising metal.

22. A method according to claim 18 wherein forming the at least one barrier layer comprises forming at least one barrier layer comprising *at least* one of tantalum nitride [and] *or* tantalum silicon nitride.

23. A method according to claim 18 wherein forming the at least one barrier layer comprises forming at least one barrier layer comprising cobalt and phosphorous.

24. A method according to claim 18 further comprising forming a displacement plated copper layer on which the at least one barrier layer is formed.

*25. A method for making an integrated circuit device, comprising:*

*forming at least one interconnect structure, wherein said forming at least one interconnect structure comprises:*

*forming a plating layer on a first copper-containing layer, wherein the plating layer includes a metal more noble than copper;*

*forming at least one barrier layer on the plating layer;*

*forming a doped copper seed layer including at least one dopant comprising calcium, cadmium, zinc, neodymium, tellurium, or ytterbium; and*

*forming a second copper-containing layer on the doped copper seed layer.*

*26. The method of claim 25, further comprising annealing the integrated circuit device after forming the second copper-containing layer to diffuse the dopant from the doped copper seed layer at least into grain boundaries of the copper-containing layer.*

*27. The method of claim 25 wherein said forming a second copper-containing layer comprises plating the second copper-containing layer.*

*28. The method of claim 25 wherein said forming a second copper-containing layer comprises forming the second copper-containing layer to include at least one dopant comprising calcium, cadmium, zinc, neodymium, tellurium, or ytterbium.*

*29. The method of claim 25 wherein said forming a second copper-containing layer comprises forming the second copper-containing layer without any calcium, cadmium, zinc, neodymium, tellurium, or ytterbium dopant therein.*

*30. The method of claim 25, further comprising:*

*forming at least one dielectric layer; and*

*forming at least one opening in the at least one dielectric layer for receiving at least part of the at least one interconnect structure therein.*

*31. The method of claim 25 wherein said forming at least one barrier layer comprises forming the at least one barrier layer comprising metal.*

*32. The method of claim 25 wherein said forming at least one barrier layer comprises forming the at least one barrier layer comprising at least one of tantalum nitride or tantalum silicon nitride.*

*33. The method of claim 25 wherein said forming at least one barrier layer comprises forming the at least one barrier layer comprising at least cobalt and phosphorous.*

*34. The method of claim 25, further comprising annealing the plating layer to drive the more noble metal into the first copper-containing layer.*

*35. The method of claim 25 wherein said forming at least one interconnect structure comprises forming the at least one interconnect structure adjacent to a substrate.*

*36. The method of claim 25 wherein the doped copper seed layer is formed on the at least one barrier layer.*

*37. The method of claim 25 wherein said forming a doped copper seed layer comprises forming the doped copper seed layer to include a dopant comprising calcium and at least one of cadmium, neodymium, tellurium, or ytterbium.*

*38. The method of claim 25 wherein said forming a doped copper seed layer comprises forming the doped copper seed layer to include a dopant comprising cadmium and at least one of calcium, neodymium, tellurium, or ytterbium.*

*39. The method of claim 25 wherein said forming a doped copper seed layer comprises forming the doped copper seed layer to include a dopant comprising neodymium and at least one of calcium, cadmium, tellurium, or ytterbium.*

*40. The method of claim 25 wherein said forming a doped copper seed layer comprises forming the doped copper seed layer to include a dopant comprising tellurium and at least one of calcium, cadmium, neodymium, or ytterbium.*

*41. The method of claim 25 wherein said forming a doped copper seed layer comprises forming the doped copper seed layer to include a dopant comprising ytterbium and at least one of calcium, cadmium, neodymium, or tellurium.*

*42. The method of claim 25 wherein said forming at least one barrier layer comprises forming the at least one barrier layer to include tantalum.*

*43. A method for making an integrated circuit device, comprising:*

*forming at least one interconnect structure, wherein said forming at least one interconnect structure comprises:*

*forming at least one barrier layer;*

*forming a doped copper seed layer including at least one dopant comprising calcium, cadmium, zinc, neodymium, tellurium, or ytterbium; and*

*forming a copper-containing layer over the doped copper seed layer, wherein at least a portion of the copper-containing layer is plated with a plating layer including a metal more noble than copper.*

*44. The method of claim 43, further comprising annealing the integrated circuit device after forming the copper-containing layer to diffuse the dopant from the doped copper seed layer at least into grain boundaries of the copper-containing layer.*

*45. The method of claim 43, further comprising annealing the plating layer to drive the more noble metal into the copper-containing layer.*

*46. The method of claim 43 wherein said forming a copper-containing layer comprises forming the copper-containing layer to include at least one dopant comprising calcium, cadmium, zinc, neodymium, tellurium, or ytterbium.*

*47. The method of claim 43, wherein said forming a copper-containing layer comprises forming the copper-containing layer without any calcium, cadmium, zinc, neodymium, tellurium, or ytterbium dopant therein.*

*48. The method of claim 43, further comprising:*

*forming at least one dielectric layer; and*

*forming at least one opening in the at least one dielectric layer for receiving the at least one interconnect structure therein.*

*49. The method of claim 43, wherein said forming at least one barrier layer comprises forming the at least one barrier layer comprising at least one of tantalum nitride or tantalum silicon nitride.*

*50. The method of claim 43, wherein forming at least one barrier layer comprises forming the at least one barrier layer comprising at least cobalt and phosphorous.*

*51. The method of claim 43, further comprising forming a displacement plated copper-containing layer on which the at least one barrier layer is formed.*

*52. The method of claim 43, wherein said forming at least one interconnect structure comprises forming the at least one interconnect structure adjacent to a substrate.*

*53. The method of claim 43, wherein the doped copper seed layer is formed on the at least one barrier layer.*

*54. A method for making an integrated circuit device, comprising:*

*forming at least one interconnect structure, wherein said forming at least one interconnect structure comprises:*

*forming at least one barrier layer;*

*forming a doped copper seed layer including at least one dopant configured to provide enhanced electromigration resistance;*

*forming a copper-containing layer on the doped copper seed layer, wherein the doped copper seed layer has a higher dopant concentration than the copper-containing layer; and*

*annealing the integrated circuit device after forming the copper-containing layer to diffuse the dopant from the doped copper seed layer at least into the copper-containing layer.*

*55. The method of claim 54, further comprising doping the copper-containing layer with at least one of calcium, cadmium, zinc, neodymium tellurium, or ytterbium prior to annealing.*

*56. The method of claim 54, wherein said forming a copper-containing layer comprises forming the copper-containing layer without any calcium, cadmium, zinc, neodymium, tellurium, or ytterbium dopant therein.*

*57. The method of claim 54, further comprising:*

*forming at least one dielectric layer; and*

*forming at least one opening in the at least one dielectric layer for receiving the at least one interconnect structure therein.*

*58. The method of claim 54, wherein said forming at least one barrier layer comprises forming the at least one barrier layer comprising metal.*

*59. The method of claim 54, wherein said forming at least one barrier layer comprises forming the at least one barrier layer comprising at least one of tantalum nitride or tantalum silicon nitride.*

*60. The method of claim 54, wherein said forming at least one barrier layer comprises forming the at least one barrier layer comprising at least cobalt and phosphorous.*

*61. The method of claim 54, further comprising forming a displacement plated copper-containing layer on which the at least one barrier layer is formed.*

*62. The method of claim 54, wherein said forming at least one interconnect structure comprises forming the at least one interconnect structure adjacent to a substrate.*

*63. The method of claim 54, wherein the doped copper seed layer is formed on the at least one barrier layer.*

*64. A method for making an integrated circuit device, comprising:*

*forming at least one interconnect structure, wherein said forming at least one interconnect structure comprises:*

*forming at least one barrier layer;*

*forming a doped copper seed layer including at least one dopant configured to provide enhanced electromigration resistance; and*

*forming a copper-containing layer over the doped copper seed layer, wherein at least a portion of the copper-containing layer is plated with a plating layer including a metal more noble than copper.*

*65. The method of claim 64, further comprising annealing the integrated circuit device after forming the copper-containing layer to diffuse the dopant from the doped copper*

*seed layer at least into grain boundaries of the copper-containing layer.*

*66. The method of claim 64, wherein the dopant comprises at least one of calcium, cadmium, neodymium, tellurium, or ytterbium.*

*67. The method of claim 64, further comprising annealing the plating layer to drive the more noble metal into the copper-containing layer.*

*68. The method of claim 64, wherein said forming a copper-containing layer comprises forming the copper-containing layer to include a dopant comprising at least one of calcium, cadmium, zinc, neodymium, tellurium, or ytterbium.*

*69. The method of claim 64, further comprising:*

*forming at least one dielectric layer; and*

*forming at least one opening in the at least one dielectric layer for receiving the at least one interconnect structure therein.*

*70. The method of claim 64, wherein said forming at least one barrier layer comprises forming the at least one barrier layer comprising metal.*

*71. The method of claim 64, wherein said forming at least one barrier layer comprises forming the at least one barrier layer comprising at least one of tantalum nitride or tantalum silicon nitride.*

*72. The method of claim 64, wherein said forming at least one barrier layer comprises forming the at least one barrier layer comprising at least cobalt and phosphorous.*

*73. The method of claim 64, further comprising forming a displacement plated copper layer on which the at least one barrier layer is formed.*

*74. The method of claim 64, wherein said forming at least one interconnect structure comprises forming the at least one interconnect structure adjacent to a substrate.*

*75. The method of claim 64, wherein the doped copper seed layer is formed on the at least one barrier layer.*

* * * * *